United States Patent [19]

Iwasa et al.

[11] Patent Number: 6,140,010
[45] Date of Patent: *Oct. 31, 2000

[54] NEGATIVE TYPE PHOTORESIST COMPOSITION USED FOR LIGHT BEAM WITH SHORT WAVELENGTH AND METHOD OF FORMING PATTERN USING THE SAME

[75] Inventors: Shigeyuki Iwasa; Katsumi Maeda; Kaichiro Nakano; Etsuo Hasegawa, all of Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/140,650

[22] Filed: Aug. 26, 1998

[30] Foreign Application Priority Data

Aug. 27, 1997 [JP] Japan .................................. 9-231343

[51] Int. Cl.$^7$ ...................................................... G03F 7/004
[52] U.S. Cl. ......................................... 430/270.1; 430/325
[58] Field of Search ................................. 430/270.1, 325

[56] References Cited

U.S. PATENT DOCUMENTS

| | | | |
|---|---|---|---|
| 5,663,035 | 9/1997 | Masuda et al. | 430/270.1 |
| 5,665,518 | 9/1997 | Maeda et al. | 430/270.1 |
| 5,851,727 | 12/1998 | Choi et al. | 430/270.1 |
| 5,863,699 | 1/1999 | Asakawa et al. | 430/270 |

FOREIGN PATENT DOCUMENTS

| | | |
|---|---|---|
| 2-15270 | 1/1990 | Japan . |
| 2-27660 | 6/1990 | Japan . |
| 5-241342 | 9/1993 | Japan . |
| 6-138660 | 5/1994 | Japan . |
| 6-199770 | 7/1994 | Japan . |
| 7-28237 | 1/1995 | Japan . |
| 7-104473 | 4/1995 | Japan . |
| 7-128859 | 5/1995 | Japan . |
| 7-252324 | 10/1995 | Japan . |
| 8-27102 | 1/1996 | Japan . |
| 8-184965 | 7/1996 | Japan . |
| 8-211598 | 8/1996 | Japan . |
| 8-240911 | 9/1996 | Japan . |
| 8-259626 | 10/1996 | Japan . |
| 9-127691 | 5/1997 | Japan . |
| 9-166868 | 6/1997 | Japan . |
| 9-221519 | 8/1997 | Japan . |
| 9-325484 | 12/1997 | Japan . |

OTHER PUBLICATIONS

Takumi Ueno et al., "Chemical Amplification Positive Resist Systems Using Novel Sulfonates as Acid Generators", Sulfonates as Acid Generators, PME '89, Kodansya, 1990, pp. 413–424.

F.M. Houlihan et al., "The Synthesis, Characterization and Lithography of α–Substituted 2-Nitrobenzyl Arylsulfonate Photo–Acid Generators with Improved Resistance to Post Exposure Bake", *SPIE*, vol. 2195, 1994, pp. 137–151.

J.V. Crivello et al., "New Photoinitiators For Cationic Polymerization", *Journal of the Polymer Science*, Symposium No. 56, 1976, pp. 383–395.

James V. Crivello et al., "A New Preparation of Triarylsulfonium and –selenonium Salts via the Copper(II)–Catalyzed Arylation of Sulfides and Selenides with Diaryliodonium Salts", *Journal of Organic Chemistry*, vol. 43, No. 15, 1978, pp. 3055–3058.

(List continued on next page.)

*Primary Examiner*—Janet Baxter
*Assistant Examiner*—Rosemary Ashton
*Attorney, Agent, or Firm*—Sughrue, Mion, Zinn, Macpeak & Seas, PLLC

[57] ABSTRACT

A negative type photoresist composition includes a polymer which contains a repetition unit which is expressed by a general chemical formula (1) and has a weight average molecule weight in a range of 1000 to 500000, a crosslinker composed of a compound which contains a functional group which is expressed by a general chemical formula (2), and a photo-acid generator which generates acid in response to a light. The general chemical formula (1) is as follows,

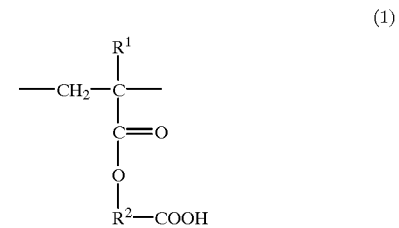

(1)

where in the general chemical formula (1), $R^1$ is a hydrogen atom or a methyl group, $R^2$ is an alkylene group containing carbon atoms in a range of 7 to 18 and having a bridged cyclic hydrocarbon group. Also, the general chemical formula (2) is as follows,

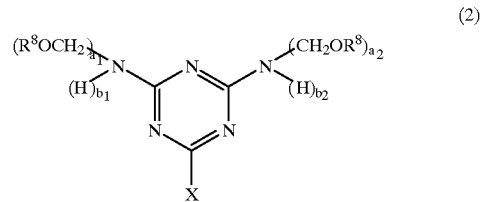

(2)

In the general chemical formula (2), X is a group expressed by a general chemical formula (3), a hydrogen atom, a hydrocarbon group containing carbon atoms in a range of 1 to 6, an alkoxy group containing carbon atoms in a range of 1 to 3, or a hydroxyl group, a1, a2 and a3 are 1 or 2, respectively, b1, b2 and b3 are 0 or 1, respectively, and a1+b1=2, a2+b2=2, and a3+b3=2, and $R^8$ is a hydrogen atom, or an alkyl group containing carbon atoms in a range of 1 to 6.

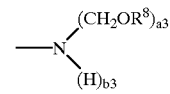

12 Claims, 1 Drawing Sheet

OTHER PUBLICATIONS

Satoshi Takechi et al., "Alicyclic Polymer for ArF and KrF Excimer Resist Based on Chemical Amplification", *Journal of Photopolymer Science and Technology*, vol. 5, No. 3, 1992, pp. 439–446.

R.D. Allen et al., "Resolution and Etch Resistance of a Family of 193 nm Positive Resists", *Journal of Photopolymer Science and Technology*, vol. 8, No. 4, 1995, pp. 623–636.

Katsumi Maeda et al., "Novel Alkaline–Soluble Alicyclic Polymer Poly(TCDMACOOH) for ArF Chemically Amplified Positive Resists", *SPIE*, vol. 2724, 1996, pp. 377–398.

James W. Thackeray et al., "Deep UV ANR Photoresists For 248 nm Excimer Laser Photolithography", *SPIE*, vol. 1086, 1989, pp. 34–47.

NEGATIVE TYPE PHOTORESIST COMPOSITION USED FOR LIGHT BEAM WITH SHORT WAVELENGTH AND METHOD OF FORMING PATTERN USING THE SAME

BACKGROUND OF THE INVENTION

1. Field of the Invention

The present invention relates to a photolithography process in a semiconductor device manufacturing process, and more particularly to a negative type photoresist composition suitable for a photolithography using a light with a short wavelength such as a light from an ArF excimer laser as an exposure light and a method of forming a pattern using the same.

2. Description of the Related Art

In the manufacturing field of various types of electronic devices among which a representative one is a semiconductor device, there is requirement of a higher density and a higher integration of devices. For this purpose, the fine processing of a half micron order is needed. Therefore, the requirement to photolithography technique for forming a fine pattern becomes increasingly more severe.

One method of forming such a fine pattern is to use a light having a shorter wavelength as an exposure light, when the pattern should be formed using a photoresist. For this purpose, the use of a KrF excimer laser as the exposure light is more positively studied at present for the mass production process of a 256-Mbit DRAM instead of the i line. The manufacture size of the 256-Mbit DRAM is equal to or less than 0.25 $\mu$m. The i line which is conventionally used has the wavelength of 365 nm, whereas the KrF excimer laser has the shorter wavelength of 248 nm.

However, a light source with a further shorter wavelength is necessary to manufacture a DRAM having a memory capacity equal to or more than 1 Gbits. The manufacture size of such a DRAM is equal to or less than 0.18 $\mu$m. Therefore, a further finer manufacture technique is required. For this reason, the use of an ArF excimer laser having the wavelength of 193 nm to the photolithography process is recently studied to satisfy the requirement. The photolithography using the excimer laser requires increase of cost performance of the laser, because the gas which is the raw materials of the laser oscillation has a short life, and the laser apparatus itself is expensive. Thus, the requirement of high sensitivity is present in addition to the high resolution such that the fine pattern forming process corresponding to the manufacture size can be accomplished.

As such a photoresist composition having high sensitivity, a chemical amplified photoresist is well known which uses a photo-acid generator which is a sensitizer. In the features of the chemically amplified photoresist, protonic acid is generated from the photo-acid generator contained in the photoresist through light irradiation of an exposure light. The protonic acid induces acid catalyst reaction to a base resin of the photoresist through heating processing after the exposure. Thus, the remarkably higher sensitivity is accomplished, compared with the conventional photoresist in which the photoreaction efficiency (that is, the reaction per a photon) is less than 1.

As a typical example of the chemical amplified photoresist, a photoresist composed of a combination of triphenylsulfonium hexafluoloarsenate and poly(p-tert-butoxycarbonyloxy-α-methylstyrene) which is disclosed in Japanese Laid Open Patent Application (JP-A-Heisei 2-15 27660) is known as a positive-type photoresist. Also, a photoresist composed of a combination of polyvinylphenol and a melamine derivative is described in Proceeding of SPIE (Vol. 1086, 1989, pp. 34–47) by L. E. Bogan et al. as a negative type photoresist. The chemical amplified photoresist is widely used as the photoresist for the KrF excimer laser at present for the high resolution and high sensitivity.

The resin which has a benzene ring such as novolak and polyvinylphenol has been used for the photoresist for the g line, the i line, and the KrF excimer light. However, the resin which contains the benzene ring has very large light absorption of the light having the wavelength equal to or less than 220 nm such as the ArF excimer laser light. For this reason, if these photoresist compositions are used for the ArF excimer light photolithography, most of the exposure light is absorbed in the photoresist surface. As a result, the laser light does not transmit to the substrate so that it is impossible to form a fine photoresist pattern. Therefore, the photoresist resin which has been used for the g line, the i line, and the KrF excimer light cannot be applied to the photolithography in which the light with the shorter wavelength equal to or less than 220 nm is used just as it is.

On the other hand, the high etching durability which is necessarily required to the photoresist for a semiconductor manufacturing process is accomplished based on the benzene ring which is contained in the photoresist compositions for the g line, the i line, and the KrF excimer light. Therefore, the photoresist for the ArF excimer light needs to be material which has the etching durability without containing any benzene ring, and which has enough transparency to the light with wavelength equal to or less than 220 nm.

A positive type photoresist compositions having enough transparency to the ArF excimer light with the wavelength of 193 nm and having the dry etching durability are studied for these several years. In the positive type photoresist, the resin containing an alicyclic group is used as base resin. For instance, a copolymer having adamantyl methacrylate unit by Takechi et al., ("Journal of Photopolymer Science and Technology", Vol. 5 (3), 1992, pp. 439–446), a copolymer having isobolnyl methacrylate unit by R. D. Allen et al., ("Journal of Photopolymer Science and Technology", Vol. 8 (4), 1995, pp. 623–636, and Vol. 9 (3), 1996, pp. 465–474), and a copolymer having carboxylated tricyclodecyl methyl methacrylate unit by Maeda et al., ("SPIE Proceeding", Vol. 2724, 1996, pp. 377–398) are known.

As described above, the positive type photoresist is known for the photolithography in which the light with the short wavelength equal to or less than 220 nm is used. Such a lighography is represented by the ArF excimer light photolithography. However, a negative type photoresist is not known. All of the conventional negative type photoresist compositions which are used for the g line, the i line, the KrF excimer light cannot be applied to the photolithography in which the light with the shorter wavelength, just as it is. This is because a benzene ring is contained in the base resin, so that the light absorption of the light having the short wavelength equal to or less than 220 nm is too large, and most of the exposure light is absorbed in the photoresist surface.

SUMMARY OF THE INVENTION

The present invention is accomplished to solve the above problems. Therefore, an object of the present invention is to provide a negative type photoresist composition which can be used for the photolithography in which a light with the wavelength equal to or less than 220 nm such as the ArF light is used as a light source, and which has enough etching durability.

Another object of the present invention is to provide a method of forming a photoresist pattern using the negative type photoresist composition.

In order to achieve an aspect of the present invention, a negative type photoresist composition includes a polymer which contains a repetition unit which is expressed by a general chemical formula (1) and has a weight average molecule weight in a range of 1000 to 500000, a crosslinker composed of a compound which contains a functional group which is expressed by a general chemical formula (2), and a photo-acid generator which generates acid in response to a light. The general chemical formula (1) is expressed as follows,

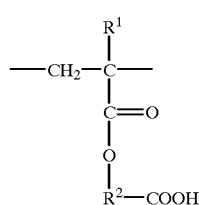

(1)

where in the general chemical formula (1), $R^1$ is a hydrogen atom or a methyl group, $R^2$ is an alkylene group containing carbon atoms in a range of 7 to 18 and having a bridged cyclic hydrocarbon group. Also, the general chemical formula (2) is expressed as follows,

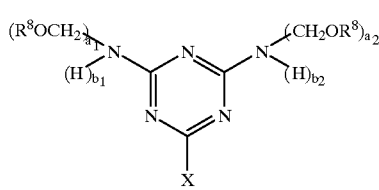

(2)

where in the general chemical formula (2), X is a hydrogen atom, a hydrocarbon group containing carbon atoms in a range of 1 to 6, an alkoxy group containing carbon atoms in a range of 1 to 3, a hydroxyl group, or a group expressed by a general chemical formula (3).

The general chemical formula (3) is expressed as follows,

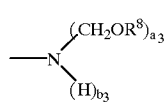

(3)

where a1, a2 and a3 are 1 or 2, respectively, b1, b2 and b3 are 0 or 1, respectively, and a1+b1=2, a2+b2=2, and a3+b3=2, and $R^8$ is a hydrogen atom, or an alkyl group containing carbon atoms in a range of 1 to 6.

The polymer may be a polymer which is expressed by a general chemical formula (4),

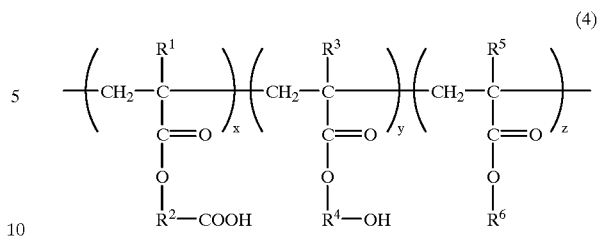

(4)

where in the general chemical formula (4), each of $R^1$, $R^3$ and $R^5$ is a hydrogen atom or a methyl group, $R^2$ and $R^4$ are an alkylene group containing carbon atoms in a range of 7 to 18 and having a bridged cyclic type hydrocarbon group, $R^6$ is a hydrogen atom or an alkyl group containing carbon atoms in a range of 1 to 12, x, y and z satisfies x+y+z=1, 0<x<1, 0<y<1, and 0≦z<1, and a weight average molecule weight of the polymer is in a range of 1000 to 500000.

The crosslinker may be melamine derivative expressed by a general chemical formula (5),

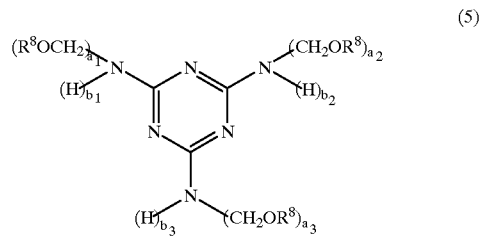

(5)

where in the general chemical formula (5), $R^8$ is a hydrogen atom or an alkyl group containing carbon atoms in a range of 1 to 6, and a1, a2 and a3=1 or 2, b1, b2 and b3=0 or 1, a1+b1=2, a2+b2=2, and a3+b3=2.

Instead, the crosslinker may be guanamine derivative which is expressed by a general chemical formula (6),

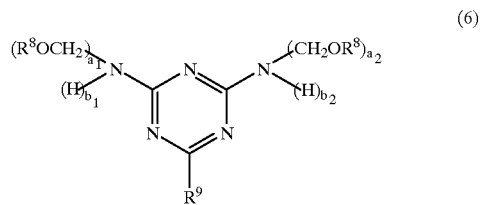

(6)

where in the general chemical formula (6), $R^8$ is a hydrogen atom or an alkyl group containing carbon atoms in a range of 1 to 6, $R^9$ is a hydrogen atom, an alkoxy group containing carbon atoms in a range of 1 to 4, or an alkyoxy group containing carbon atoms in a range of 1 to 4, or a hydroxyl group, and a1 and a2=1 or 2, b1 and b2=0 or 1, a1+b1=2, and a2+b2=2.

The photo-acid generator may be a sulfonium salt compound which is expressed by a general chemical formula (7),

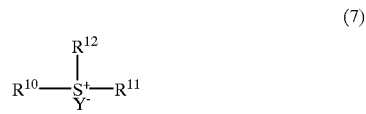

(7)

where in the general chemical formula (7), $R^{10}$, $R^{11}$ and $R^{12}$ are respectively independently alkyl substituted, halogen substituted or an aromatic group of non-substitution, an alicyclic group, a bridged cyclic hydrocarbon group, 2-oxoalicyclic group, or an alkyl group, and Y⁻ is a counter anion expressed by $BF_4^-$, $AsF_6^-$, $SbF_6^-$ or a general chemical formula (8),

(8)

where in the general chemical formula (8), Z is $C_nF_{2n+1}$ (n is an integer in a range from 1 to 6), or an alkyl group, alkyl substituted, halogen substituted, or an aromatic group of non-substitution.

Instead, the photo-acid generator may be an iodonium salt compound which is expressed by a general chemical formula (9),

(9)

where in the general chemical formula (9), $R^{13}$ and $R^{14}$ are respectively independently alkyl substituted, halogen substituted, an aromatic group of non-substitution, an alicyclic group, a bridged cyclic hydrocarbon group, 2-oxoalicyclic group, or an alkyl group, and Y⁻ is a counter anion expressed by $BF_4^-$, $AsF_6^-$, $SbF_6^-$, or a general chemical formula (8),

(8)

where in the general chemical formula (8), Z is $C_nF_{2n+1}$ (n is an integer in a range from 1 to 6), an alkyl group, alkyl substituted, halogen substituted or an aromatic group of non-substitution.

In addition, the photo-acid generator may be a succinimide derivative which is expressed by a general chemical formula (10),

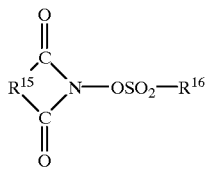
(10)

wherein in the general chemical formula (10), $R^{15}$ is halogen substituted, or an alkylene group of non-substitution, alkyl substituted, halogen substituted, or an aromatic group of non-substitution, $R^{16}$ is halogen substituted, an alkyl group of non-substitution, an alkyl group, halogen substituted or an aromatic group of non-substitution.

Otherwise, the photo-acid generator is a diazomethane derivative which is expressed by a general chemical formula (11),

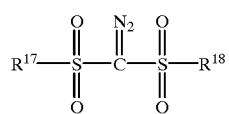
(11)

where in the general chemical formula (11), $R^{17}$ and $R^{18}$ are respectively independently an alkyl group, alkyl substituted, halogen substituted or an aromatic group of non-substitution, an alicyclic hydrocarbon group, or a bridged cyclic hydrocarbon group.

In the above, the negative type photoresist composition desirably contains the polymer expressed by the general chemical formula (1) of 50–98 weight percents, the crosslinker of 1–50 weight percents, and the photo-acid generator of 0.2–15 weight percents.

In order to achieve another aspect of the present invention, a method of forming a photoresist pattern, includes the steps of:

applying a negative type photoresist composition on a substrate;

exposing the negative type photoresist composition by a light with a wavelength of 180 to 220 nm;

performing baking of the substrate on which the negative type photoresist composition is applied; and performing development of the baked substrate.

The negative type photoresist composition includes:

a polymer which contains a repetition unit which is expressed by a general chemical formula (1);

a crosslinker composed of a compound which contains a functional group which is expressed by a general chemical formula (2); and a photo-acid generator which generates acid in response to a light,

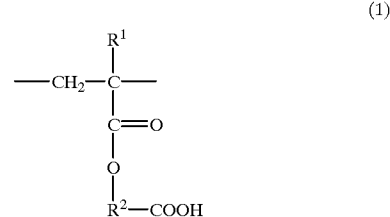
(1)

where in the general chemical formula (1), $R^1$ is a hydrogen atom or a methyl group, $R^2$ is an alkylene group containing carbon atoms in a range of 7 to 18 and having a bridged cyclic hydrocarbon group, and a weight average molecule weight of the polymer is in a range of 1000 to 500000, and

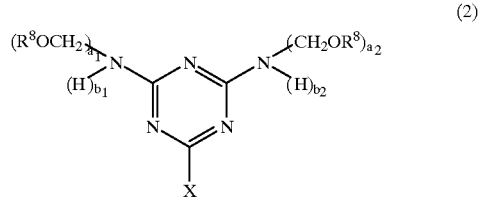
(2)

where in the general chemical formula (2), X is a group expressed by a general chemical formula (3),

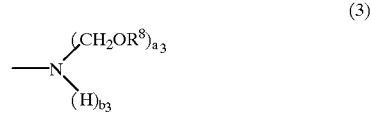
(3)

a hydrogen atom, a hydrocarbon group containing carbon atoms in a range of 1 to 6, an alkoxy group containing carbon atoms in a range of 1 to 3, or a hydroxyl group, a1, a2 and a3 are 1 or 2, respectively, b1, b2 and b3 are 0 or 1, respectively, and a1+b1=2, a2+b2=2, and a3+b3=2, and $R^8$ is a hydrogen atom, or an alkyl group containing carbon atoms in a range of 1 to 6.

The light with the wavelength of 180 nm to 220 nm is an ArF excimer laser light.

DESCRIPTION OF THE PREFERRED EMBODIMENTS

Figure 1A:
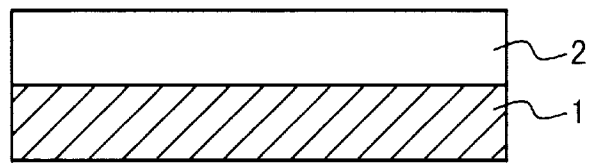
FIGS. 1A to 1D are diagrams illustrating a method of forming a photoresist pattern in the present invention.

The negative type photoresist composition of the present invention will be described below in detail.

As a negative type photoresist composition includes a polymer which contains a repetition unit which is expressed by a general chemical formula (1) and has a weight average molecule weight in a range of 1000 to 500000, a crosslinker composed of a compound which contains a functional group which is expressed by a general chemical formula (2), and a photo-acid generator which generates acid in response to a light. The general chemical formula (1) is expressed as follows,

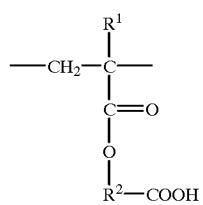
(1)

where in the general chemical formula (1), $R^1$ is a hydrogen atom or a methyl group, $R^2$ is an alkylene group containing carbon atoms in a range of 7 to 18 and having a bridged cyclic hydrocarbon group. Also, the general chemical formula (2) is expressed as follows,

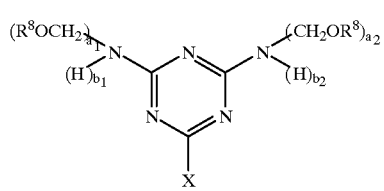
(2)

where in the general chemical formula (2), X is a hydrogen atom, a hydrocarbon group containing carbon atoms in a range of 1 to 6, an alkoxy group containing carbon atoms in a range of 1 to 3, a hydroxyl group, or a group expressed by a general chemical formula (3).

The general chemical formula (3) is expressed as follows,

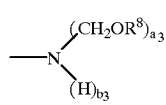
(3)

where a1, a2 and a3 are 1 or 2, respectively, b1, b2 and b3 are 0 or 1, respectively, and a1+b1=2, a2+b2=2, and a3+b3=2, and $R^8$ is a hydrogen atom, or an alkyl group containing carbon atoms in a range of 1 to 6.

The polymer may be a polymer which is expressed by a general chemical formula (4),

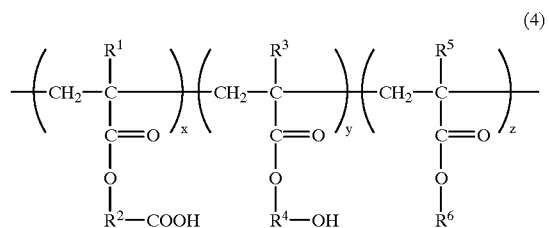
(4)

where in the general chemical formula (4), each of $R^1$, $R^3$ and $R^5$ is a hydrogen atom or a methyl group, $R^2$ and $R^4$ are an alkylene group containing carbon atoms in a range of 7 to 18 and having a bridged cyclic hydrocarbon group, $R^6$ is a hydrogen atom or an alkyl group containing carbon atoms in a range of 1 to 12, x, y and z satisfies x+y+z=1, 0<x<1, 0<y<1, and 0≦z<1, and a weight average molecule weight of the polymer is in a range of 1000 to 500000.

The crosslinker may be melamine derivative expressed by a general chemical formula (5),

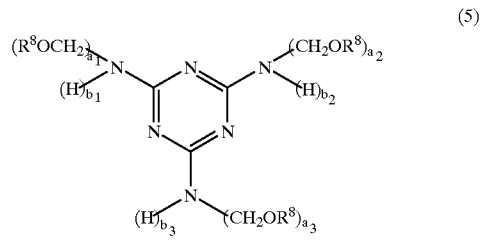
(5)

where in the general chemical formula (5), $R^8$ is a hydrogen atom or an alkyl group containing carbon atoms in a range of 1 to 6, and a1, a2 and a3=1 or 2, b1, b2 and b3=0 or 1, a1+b1=2, a2+b2=2, and a3+b3=2.

Instead, the crosslinker may be guanamine derivative which is expressed by a general chemical formula (6),

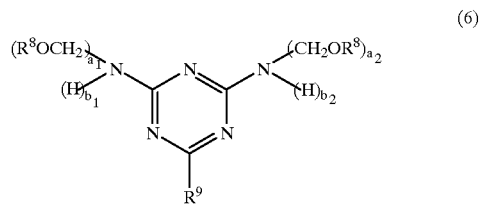
(6)

where in the general chemical formula (6), $R^8$ is a hydrogen atom or an alkyl group containing carbon atoms in a range of 1 to 6, $R^9$ is a hydrogen atom, an alkoxy group containing carbon atoms in a range of 1 to 4, or an alkyoxy group containing carbon atoms in a range of 1 to 4, or a hydroxyl group, and a1 and a2=1 or 2, b1 and b2=0 or 1, a1+b1=2, and a2+b2=2.

The photo-acid generator may be a sulfonium salt compound which is expressed by a general chemical formula (7), (7)

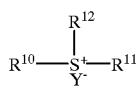

where in the general chemical formula (7), $R^{10}$, $R^{11}$ and $R^{12}$ are respectively independently alkyl substituted, halogen substituted or an aromatic group of non-substitution, an alicyclic group, a bridged cyclic hydrocarbon group, 2-oxoalicyclic group, or an alkyl group, and $Y^-$ is a counter anion expressed by $BF_4^-$, $AsF_6^-$, $SbF_6^-$ or a general chemical formula (8), (8)

where in the general chemical formula (8), Z is $C_nF_{2n+1}$ (n is an integer in a range from 1 to 6), or an alkyl group, alkyl substituted, halogen substituted, or an aromatic group of non-substitution.

Instead, the photo-acid generator may be an iodonium salt compound which is expressed by a general chemical formula (9), (9)

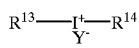

where in the general chemical formula (9), $R^{13}$ and $R^{14}$ are respectively independently alkyl substituted, halogen substituted, an aromatic group of non-substitution, an alicyclic group, a bridged cyclic hydrocarbon group, 2-oxoalicyclic group, or an alkyl group, and $Y^-$ is a counter anion expressed by $BF_4^-$, $AsF_6^-$, $SbF_6^-$, or a general chemical formula (8), (8)

where in the general chemical formula (8), Z is $C_nF_{2n+1}$ (n is an integer in a range from 1 to 6), an alkyl group, alkyl substituted, halogen substituted or an aromatic group of non-substitution.

In addition, the photo-acid generator may be a succinimide derivative which is expressed by a general chemical formula (10), (10)

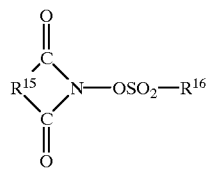

wherein in the general chemical formula (10), $R^{15}$ is halogen substituted, or an alkylene group of non-substitution, alkyl substituted, halogen substituted, or an aromatic group of non-substitution, $R^{16}$ is halogen substituted, an alkyl group of non-substitution, an alkyl group, halogen substituted or an aromatic group of non-substitution.

Otherwise, the photo-acid generator is a diazomethane derivative which is expressed by a general chemical formula (11), (11)

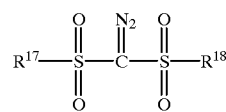

where in the general chemical formula (11), $R^{17}$ and $R^{18}$ are respectively independently an alkyl group, alkyl substituted, halogen substituted or an aromatic group of non-substitution, an alicyclic hydrocarbon group, or a bridged cyclic hydrocarbon group.

In the general chemical formula (1), as the alkylene group containing carbon atoms in a range of 7 to 18, having a bridged cyclic hydrocarbon group, and indicated by $R^2$, there are a tricyclo[$5.2.1.0^{2,6}$]decylmethylene group, a tricyclo[$5.2.1.0^{2,6}$]decane-diyl group, an adamantane-diyl group, a norbornane-diyl group, a methylnorbornane-diyl group, an isobornane-diyl group, a tetracyclo[$4.4.0.1^{2,5}.1^{7,10}$]dodecane-diyl group, a methyltetracyclo[4.4.0.12,5.17,10]dodecane-diyl group, a hexacyclo[$6.6.1.1^{3,6}.1^{10,13}.0^{2,7}.0^{9,14}$]heptadecane-diyl group, a methylhexacyclo[$6.6.1.1^{3,6}.1^{10,13}.0^{2,7}.0^{9,14}$]heptadecane-diyl group, as shown in a table 1. However, such an alkylene group is not limited to them.

TABLE 1

| $R^2$ |
| --- |
| tricyclo[$5.2.1.0^{2,6}$]decylmethylene group, 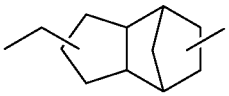 or 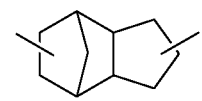 |
| a tricyclo[$5.2.1.0^{2,6}$]decane-diyl group, 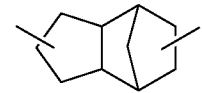 or |
| an adamantane-diyl group, 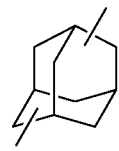 |
| a norbornane-diyl group, |

TABLE 1-continued

R²

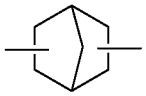

a methylnorbornane-diyl group,

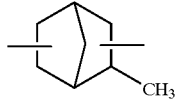

an isobornane-diyl group,

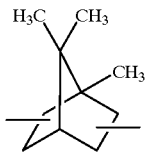

a tetracyclo[4.4.0.1$^{2,5}$.1$^{7,10}$]dodecane-diyl group,

a methyltetracyclo[4.4.0.1$^{2,5}$.1$^{7,10}$]dodecane-diyl group,

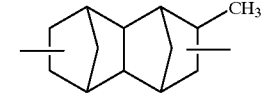

a hexacyclo[6.6.1.1$^{3,6}$.1$^{10,13}$.0$^{2,7}$.0$^{9,14}$]heptadecane-diyl group

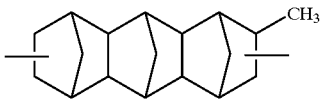

a methylhexacyclo[6.6.1.1$^{3,6}$.1$^{10,13}$.0$^{2,7}$.0$^{9,14}$]heptadecane-diyl group,

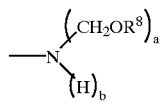

In the photoresist composition of the present invention, the carboxyl group of the polymer which has the repetition unit expressed by the general chemical formula (1) has the property to combine with a group expressed by the following general chemical formula (12) of the compound expressed by the general chemical formula (2) under the existence of acid catalyst, as shown in the following reaction formula (A).

$$-N\begin{pmatrix}(CH_2OR^8)_a\\(H)_b\end{pmatrix} \quad (12)$$

where in the general chemical formula (12), R$^8$ is a hydrogen atom or an alkyl group containing carbon atoms in a range of 1 to 6, a is 1 or 2, b is 0 or 1, and a+b=2. The reaction equation (A) is as follows,

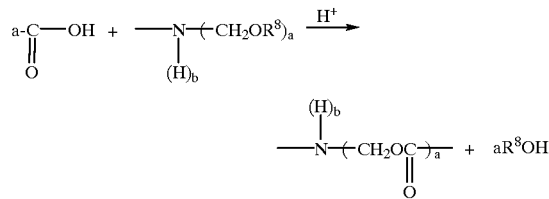

where in the reaction equation (A), R$^8$ is a hydrogen atom or an alkyl group containing carbon atoms in a range of 1 to 6, a is 1 or 2, b is 0 or 1, and a+b=2.

The compound which is expressed by the general chemical formula (2) has two or more groups which are expressed by the general chemical formula (12), i.e., the groups reactable with carboxylic acid. For this reason, one molecule of the compound can combine with the polymer of 2 or more molecules. The compound which is expressed by the general chemical formula (2) performs bridging between the polymers under the existence of acid catalyst. Because the polymer has a carboxyl group, the polymer is soluble to alkaline developer. However, when the bridging is performed to form a three-dimensional reticular structure, the polymer does not solve to the alkaline developer.

Thus, the photoresist composition of the present invention composed of the polymer which contains the repetition unit which is expressed by the general chemical formula (1), the compound which is expressed by the general chemical formula (2), and the photo-acid generator is applied to form a thin film. Then, the photoresist film is exposed by a deep UV light such as the ArF excimer laser light. At this time, acid is generated from the photo-acid generator in the exposed area. When heating is performed, the bridging is performed between the polymers because the acid functions as a catalyst. As a result, the exposed area becomes insoluble to the developer. In this manner, a negative type pattern can be obtained.

As the polymer for the negative type photoresist composition of the present invention, the polymer which is expressed by the general chemical formula (4), in other words, the polymer in which the repetition unit which is expressed by a general chemical formula (1) and an alicyclic group unit containing the hydroxyl group are combined is also very effective, in addition to the polymer which contains the repetition unit which is expressed by the general chemical formula (1). This is because the hydroxyl group is also possible to combine with the compound which is expressed by a general chemical formula (2) under the existence of the acid catalyst, as show by the following reaction formula (B).

Therefore, the negative type photoresist composition composed of the polymer which is expressed by the general chemical formula (4), the compound which is expressed by the general chemical formula (2), and the photo-acid generator which generates acid by the exposure has a high transparency to the light with the short wavelength of equal to or less than 220 nm such as the ArF excimer laser light and high dry etching durability.

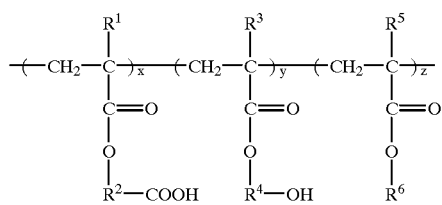

(4)

where in the general chemical formula (4), $R^1$, $R^3$ and $R^5$ are a hydrogen atom or a methyl group, $R^2$ and $R^4$ are an alkylene group containing carbon atoms in a range of 7 to 18 and having a bridged cyclic hydrocarbon group, $R^6$ is a hydrogen atom or an alkyl group containing carbon atoms in a range of 1 to 12, x, y and z are the ratios of the repetition units and satisfy $x+y+z=1$, $0<x\leq1$, $0<y<1$, and $0\leq z<1$, and the weight average molecule weight of the polymer is in a range of 1000 to 500000.

reaction equation (B)

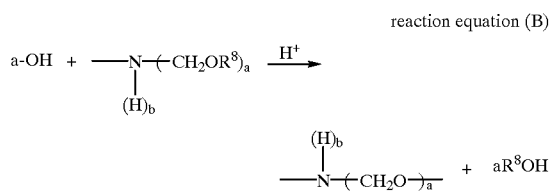

where in the reaction equation (A), $R^8$ is a hydrogen atom or an alkyl group containing carbon atoms in a range of 1 to 6, a is 1 or 2, b is 0 or 1, and $a+b=2$.

In the general chemical formula (4), the alkylene group containing carbon atoms in a range of 7 to 18, having a bridged cyclic hydrocarbon group, and expressed by $R^2$ and $R^4$ is shown in the table 1, but not limited to them. The alkyl group containing carbon atoms in a range of 1 to 12, and expressed by $R^6$ is a methyl group, an ethyl group, a propyl group, a butyl group, a pentyl group, a hexyl group, a heptyl group, an octyl group, a cyclopentyl group, a cyclohexyl group, a tricyclo[5.2.1.0$^{2,6}$]decyl group, an adamantyl group, a norbornyl group, a tetracyclo[4.4.0.1$^{2,5}$.1$^{7,10}$] dodecyl group, but not limited to them.

The negative type photoresist composition of the present invention uses as a base resin the polymer which has an alicyclic group by which it is possible to obtained high dry etching durability. Also, because the polymer does not have a benzene ring, the polymer has a high transparency to the light with the short wavelength equal to or less than 220 nm such as an ArF excimer laser light of 193.4 nm. In other words, the photoresist composition of the present invention is a chemical amplified photoresist, and has both of the high transparency to the light with the short wavelength equal to or less than 220 nm such as the ArF excimer laser light and high dry etching durability.

The polymer which is expressed by the general chemical formula (1) in the negative type photoresist composition of the present invention is possible to obtain by the method described in Japanese Laid Open Patent Application (JP-A-Heisei 8-259626). More specifically, in case of single polymer, the polymer can be obtained by synthesizing a vinyl monomer having a bridged cyclic hydrocarbon group with carboxyl group, and then by adding a suitable radical polymerization initiator, for example, azobisisobutyronitrile (AIBN) in the dried tetrahydrofuran under the ambience of an inactive gas such as an argon gas and a nitrogen gas, and by stirring and heating for 0.5 to 12 hours at the temperature of 50 to 70° C.

Similarly, the polymer expressed by the general chemical formula (4) can be obtained by copolymerizing a vinyl polymer having a carboxyl group, and a vinyl polymer having a hydroxyl group, and a polymerizable monomer, if necessary, in a block manner or in random. When the copolymerization ratio of the polymers which is expressed by the general chemical formula (4) is selected with respect to a monomer addition ratio and other polymerization conditions, an optional copolymer can be obtained. It should be noted that x is desirably equal to or more than 0.2 in the general chemical formula (4).

Also, the weight average molecule weight of the polymer in the negative type photoresist composition of the present invention is in a range of 1000 to 500000, and more desirably is in a range of 5000 to 200000. This is because the glass transition point of the polymer becomes low so that it is difficult to handle as the photoresist, when the molecular weight is less than 1000, and also, it is difficult to form a uniform film on a substrate when the molecular weight is equal to or more than 500000. It should be noted that the weight average molecule weight of the polymer is determined as a polystyrene equivalent molecular weight using gel permiation chromatography (LC-9A available from Shimadzu Seisakusyo (flowing solvent: tetrahydrofuran, column: KF-80M made by Showa Denkou)).

When the crosslinker in the negative type photoresist composition of the present invention is the compound expressed by the general chemical formula (2), melamine derivative expressed by a general chemical formula (5) or guanamine derivative expressed by a general chemical formula (6) is suitable for the crosslinker. This is because the compound has high reactivity to a carboxyl group and a hydroxyl group. The compound can be obtained by methylolating melamine or guanamine by formaldehyde.

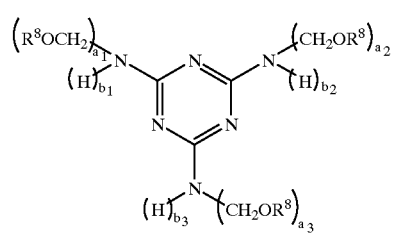

(5)

where in the general chemical formula (5), $R^8$ is a hydrogen atom or an alkyl group containing carbon atoms in a range of 1 to 6, a1, a2 and a3 are 1 or 2, respectively, b1, b2 and b3 are 0 or 1, respectively, and $a1+b1=2$, $a2+b2=2$, and $a3+b3=2$.

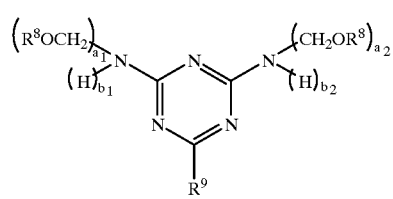

(6)

where in the general chemical formula (6), $R^8$ is a hydrogen atom or an alkyl group containing carbon atoms in a range of 1 to 6, R9 is a hydrogen atom, an alkyl group containing carbon atoms in a range of 1 to 4, alkoxy group containing carbon atoms in a range of 1 to 4 or a hydroxyl group, a1 and a2 are 1 or 2, respectively, b1 and b2 are 0 or 1, respectively, and $a1+b1=2$, and $a2+b2=2$.

In the above description, the alkyl group containing carbon atoms in a range of 1 to 6 and expressed by $R^8$ is a methyl group, an ethyl group, a propyl group having a straight chain or a branch, a butyl group having a straight chain or a branch, a pentyl group having a straight chain, a branch or a ring, or a hexyl group having straight chain, a branch or a ring. The alkyl group containing carbon atoms in a range of 1 to 4 and expressed by $R^9$ is a methyl group, an ethyl group, a propyl group having a straight chain or a branch, or a butyl group having a straight chain or a branch. The alkoxyl group containing carbon atoms in a range of 1 to 4 and expressed by $R^9$ is a methoxy group, an ethoxy group, a propoxy group having a straight chain or a branch, or a butoxy group having a straight chain or a branch.

The photo-acid generator of the photoresist composition of the present invention is desirable to generate acid through the irradiation of a light with the wavelength of 180 nm to 220 nm. Also, it is necessary that a mixture with the above-mentioned polymer of the photoresist composition of the present invention is sufficiently soluble to organic solvent so that a uniform film can be formed from the solution by a film forming method such as a spin coating method. If these conditions are satisfied, any kind of photo-acid generator can be used. Also, a single type of photo-acid generator may be used or mixture of 2 or more kinds of photo-acid generators may be used.

As an example of the practicable photo-acid generator, there can be used sulfonium salt compound which is expressed by the following general chemical formula (7), iodonium salt compound which is expressed by the following general chemical formula (9), succinimide derivative which is expressed by the following general chemical formula (10), diazo compound which is expressed by the following general chemical formula (11), 2,6-dinitrobenzyl ester, disulfon compound and so on.

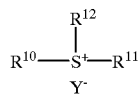
(7)

where in the general chemical formula (7), $R^{10}$, $R^{11}$ and $R^{12}$ are respectively independently alkyl substituted, halogen substituted or an aromatic group of non-substitution, an alicyclic group, a bridged cyclic hydrocarbon group, a 2-oxoalicyclic group, or an alkyl group, and $Y^-$ is a counter anion expressed by $BF_4^-$, $AsF_6^-$, $SbF_6^-$ or the general chemical formula (8).

(8)

where in the general chemical formula (10), Z is $C_nF_{2n+1}$ (n is an integer from 1 to 6), an alkyl group, alkyl substituted, halogen substituted or an aromatic group of non-substitution.

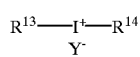
(9)

where in the general chemical formula (9), $R^{13}$ and $R^{14}$ are respectively independently an alkyl group, halogen substituted or aromatic group of non-substitution, an alicyclic group, a bridged cyclic hydrocarbon group, a 2-oxoalicyclic group, or an alkyl group, and $Y^-$ is a counter anion expressed by $BF_4^-$, $AsF_6^-$, $SbF_6^-$ or the general chemical formula (10)

(8)

where in the general chemical formula (8), Z is $C_nF_{2n+1}$ (n is an integer from 1 to 6), an alkyl group, alkyl substituted, halogen substituted or an aromatic group of non-substitution.

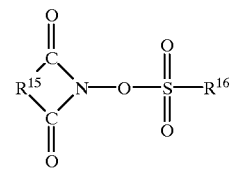
(10)

where in the general chemical formula (10), $R^{15}$ is halogen substituted, an alkyl group of non-substitution, alkyl substituted, halogen substituted or an aromatic group of non-substitution, and $R^{16}$ is halogen substituted, or an alkyl group of non-substitution, an alkyl group, a halogen substituted or an aromatic group of non-substitution.

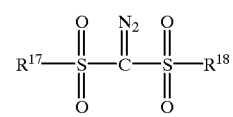
(11)

where in the general chemical formula (11), $R^{17}$ and $R^{18}$ are respectively independently an alkyl group, an alkyl, halogen substituted or an aromatic group of non-substitution, an alkyl group, an alicyclic hydrocarbon group, or a bridged cyclic hydrocarbon group.

As the examples of them, there are known triphenylsulfonium salt derivative by J. V. Crivello et al., (Journal of the Organic Chemistry, Vol. 43, No. 15, 1978, pp. 3055 to 3058), diphenyliodonium salt derivative by J. V. Crivello et al., (Journal of the Polymer Science, Vol. 56, 1976, pp. 383 to 395), alkylsulfonium salt deribative such as cyclohexylmethyl (2-oxocyclohexyl) sulfonium trifluoromethane sulfonate described in Japanese Laid Open Patent Application (JP-A-Heisei 7-28237), and sulfonium salt compound having a bridged cyclic alkyl group such as β-oxocyclohexylmethyl (2-norbornyl) sulfonium trifluoromethane sulfonate described in Japanese Laid Open Patent Application (JP-A-Heisei 8-27102). Also, in addition, there are known 2-nitrobenzyl ester by F. M. Houlihan et al., (SPIE proceeding, Vol. 2195, 1994, p. 137 ), 1,2,3-tri (methansulfonyloxy)benzen by Takumi Ueno et al., (proceeding of PME '89, Kodansya, 1990, pp. 413 to 424, disulfonium salt compound and so on.

The containing percentage of the polymer which contains the repetition unit expressed by the general chemical formula (1) or the polymer which is expressed by the general chemical formula (4) in the negative type photoresist composition of the present invention is the weight percent of 50 to 98, desirably, the weight percent from 70 to 95 in case of 100 weight percents including the polymer. When the containing percentage of the polymer is less than 50 weight percent, it is difficult to form a uniform film. Also, when the containing percentage of the polymer is at equal to or more than 98 weight percent, the quantity of the crosslinker expressed by the general chemical formula (2) and the quantity of the photo-acid generator which can be introduced becomes necessarily less. As a result, the bridging cannot be sufficiently accomplished so that a pattern is not obtained.

Also, the containing percentage of the crosslinker expressed by either of the general chemical formula (2) is the weight percent of 1 to 50, desirably, the weight percent from 10 to 30 in case of 100 weight percents including the crosslinker. When the containing percentage of the polymer is less than 1 weight percent, the bridging for the polymerization is not sufficiently accomplished. As a result, a pattern is not obtained. Also, the containing percentage of the polymer is equal to or more than 50 weight percent, it is difficult to form a uniform film and the transmittance of the film sometimes decreases. Moreover, the containing percentage of the polymer is also insufficient so that sometimes enough etching durability cannot be accomplished.

Also, the containing percentage of the photo-acid generator is the weight percents of 0.2 to 15, desirably the weight percent of 0.5 to 10 in case of 100 weight percents including the photo-acid generator. When the containing percentage of the photo-acid generator is less than 0.2 weight percent, the sensitivity of the negative type photoresist composition of the present invention decreases remarkably. Therefore, in this containing percentage, it is difficult to form a pattern. Also, when the containing percentage of the photo-acid generator is beyond 15 weight percent, there are problems in that the formation of a uniform application film becomes difficult, and it becomes easy for scum to be generated after development.

Organic solvent in which the negative type photoresist composition of the present invention can be dissolved sufficiently and to which a method such as a spin coating method can be applied such that a uniform application film can be formed is desirable as solvent to be used for a present invention. If the above conditions are satisfied, any kind of solvent can be used. Also, a single kind of solvent or more than 2 kinds of solvent may be used. Specifically, there are n-propyl alcohol, isopropyl alcohol, n-butyl alcohol, tert-butyl alcohol, methyl cellosolve acetate, ethyl cellosolve acetate, propyleneglycol monoethyl ether acetate (1-methoxy-2-acetoxypropane), methyl lactate, ethyl lactate, 2-methoxybutyl acetate, 2-ethoxyethyl acetate, methyl pyruvate, ethyl pyruvate, methyl 3-methoxypropionate, ethyl 3-methoxypropionate, N-methyl-2-pirrolidinone, cyclohexanone, cyclopentanone, cyclohexanol, Methyl ethyl ketone, 1,4-dioxane, ethylene glycol monomethyl ether, ethylene glycol monomethyl ether acetate, ethylene glycol monoethyl ether, ethylene glycol monoethyl ether acetate, ethylene glycol monoisopropyl ether, diethylene glycol monomethyl ether, and diethylene glycol dimethyl ether. However, the solvent is not limited to them, of course.

Also, the photoresist composition of the present invention may be added with the other ingredients such as a surface-active agent, a pigment, a stabilizing agent, an applicability improving agent, a dyestuff in accordance with necessity. Also, the present invention provides a method of forming a negative type photoresist pattern on a substrate to be processed using the above negative type photoresist material.

A method of forming a negative type photoresist pattern of the present invention is shown in FIGS. 1A to 1D. First, as shown in FIG. 1A, the negative type photoresist material of the present invention is applied onto a substrate 1 to be processed. Then, a pre-baking process is performed by heating means such as a hot plate at the temperature of 60 to 170° C. for 30 to 240 seconds to form a photoresist film 2.

Figure 1B:
Figure 1B:
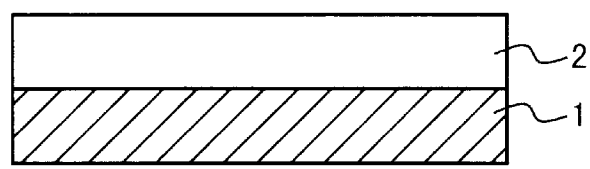
Figure 1C:
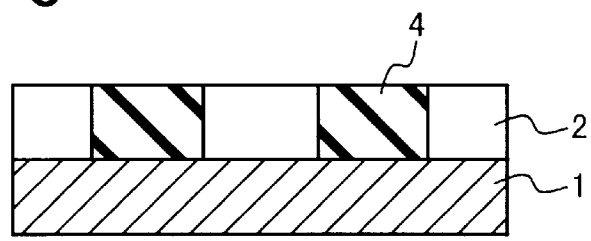

Next, as shown in FIGS. 1B and 1C, the photoresist film 2 is selectively exposed by use of an exposure unit. Then, after the exposure, a heating process is performed to a photoresist film 2. As a result, the bridging of resin occurs in an exposure area 4.

Figure 1D:
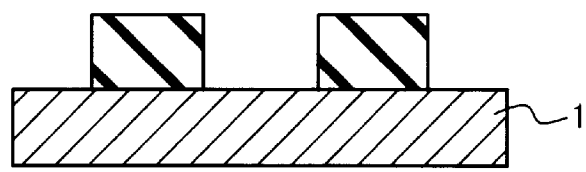

Finally, as shown in FIG. 1D, only the non-exposure portion of the photoresist film 2 is selectively dissolved and removed by alkaline developer such as tetramethylammonium hydroxide (TMAH). Thus, a negative type photoresist pattern is formed.

The negative type photoresist material of the present invention has a high transparency to a light with the wavelength equal to or less than 220 nm such as an ArF excimer laser light. Also, the negative type photoresist material has dry etching durability and high resolution. Therefore, the negative type photoresist material of the present invention can be utilized as a new negative type photoresist material for manufacture of semiconductor devices. By using the negative type photoresist material of the present invention for a photolithography process, the negative type photoresist pattern can be formed.

EMBODIMENT EXAMPLES

Next, the present invention will be described in detail in the following embodiment examples but the present invention is not limited at all by these embodiment examples.

(Embodiment 1)

The photoresist having the following composition is produced. The following experiment is performed under a yellow lamp.

(a) resin A1 (a polymer shown by the following general chemical formula (A1) and having the weight average molecule weight 28000) 4.2 g (b) MW30 (commercially available from Sanwa Chemical) (main ingredient: B1 shown below) 0.75 g (c) norbornyl(2-oxocyclohexyl)methylsulfonium trifluoromethanesulfonate (C1 shown below) 0.05 g (d) propylene glycol monomethyl ether acetate 30 g The chemical formula A1 is as follows,

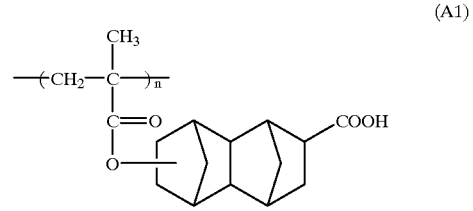

The chemical formula B1 is as follows,

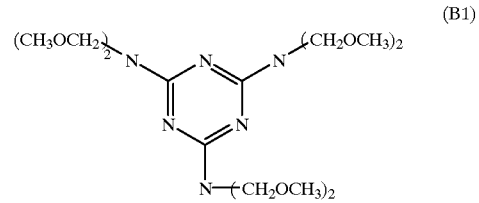

The chemical formula C1 is as follows,

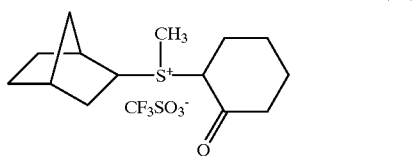
(C1)

The above mixture is filtered with a Tetoron filter of 0.2 μm to produce the photoresist material. The photoresist material is applied on a quartz substrate of 3-inch by a spin coating method, and is heated on a hot plate for 60 seconds at 100° C. to form the film with the film thickness of 0.5 μm. The transmittance of this film to the light with the wavelength of 193.4 nm (a central wavelength of the ArF excimer laser light) was 58%. This is an enough transparency as a single layer photoresist.

(Embodiment 2)

Like the embodiment 1, the photoresist material was produced using methylated dimethylolguanamine (B2 shown below) instead of MW30. Then, a film was formed from the photoresist material and the transmittance of the film was measured. As a result, the transmittance was 58% for the light with the wavelength of 193.4 nm and showed an enough transparency as a single layer photoresist.

The chemical formula B2 is as follows,

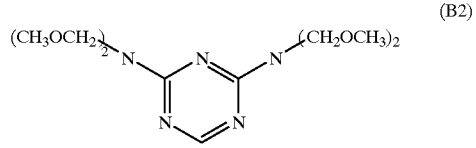
(B2)

(Embodiment 3)

Like the embodiment 1, the photoresist material was produced using resin A2 which has the weight average molecule weight of 21000 (A2 shown below) instead of the resin A1. Then, the transmittance of a thin film formed from the photoresist material was measured. As a result, the transmittance was 59% for the light with the wavelength of 193.4 nm and showed an enough transparency as a single layer photoresist. The chemical formula A2 is as follow

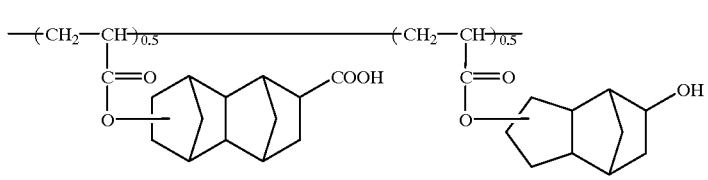
(A2)

(Embodiment 4)

Like the embodiment 1, the photoresist material was produced using propylene glycol monoethyl etheracetate of 20 g.

The photoresist material was applied on a quartz substrate of 3-inch by a spin coating method, and was heated on a hot plate for 60 seconds at 100° C. to form the film with the film thickness of 0.7 μm. The etching rate of the formed film to a CF4 gas was measured by use of a reactive ion etching (RIE) apparatus DEM451 commercially available from Nichiden Aneruva (etching condition: Power=100 W, pressure=5 Pa, and gas flow rate=30 sccm). The measuring results are shown in a table 2. The measuring results of novoLak photoresist as a comparative example (PFI-15A from Sumitomo Chemical Co.), poly(p-vinylphenol) which is used as base resin of a KrF photoresist, and a poly(methyl methaclylate) application film which is a resin not to have a bridged cyclic hydrocarbon group in the molecule structure are also shown. It should be noted that the etching rage is normalized with respect to that of the novolak photoresist. From the obtained results, the etching rate to CF4 gas is slow and the photoresist of the present invention is excellent in the dry etching durability.

It will be shown that the photoresist of the present invention has high dry etching durability.

(Embodiment 5)

Like the embodiment 4, the etching rate of the photoresist material using resin A2 instead of the resin A1 was measured. The measuring results are shown in a table 2. From the obtained results, it is shown that the photoresist of the present invention has a low etching rate to the CF4 gas and is excellent in the dry etching durability. That is, the photoresist of the present invention has a high dry etching durability.

TABLE 2

| | etching rate (relative ratio) |
|---|---|
| Embodiment 4 | 1.15 |
| Embodiment 5 | 1.19 |
| poly(methyl methaclylate) | 1.9 |
| poly(p-vinylphenol) | 1.2 |
| novolak photoresist (PFI-15A) | 1 |

(Embodiment 6)

The photoresist having the following composition is produced. The following experiment was performed under a yellow lamp.

(a) resin A1 (A1 shown in the embodiment 1) 4 g
(b) MW30 (used in the embodiment 1) 1 g
(c) norbornyl(2-oxocyclohexyl)methylsulfonium trifluoromethanesulfonate (C1 shown in the embodiment 1) 0.01 g
(d) propylene glycol monomethyl ether acetate 22.7 g The above mixture is filtered with a Tetoron filter of 0.2 μm to produce the photoresist material. The photoresist material is applied on a quartz substrate of 4-inch by a spin coating method, and is heated on a hot plate for 60 seconds at 100° C. to form the film with the film thickness of 0.5 μm. The film is stationarily located in a contact exposure system which is sufficiently purged with a nitrogen gas. A mask in which a pattern is drawn with chrome on a quartz plate is fitly located on the photoresist film and the ArF excimer laser light is irradiated through the mask. Immediately after the irradiation, a baking process is performed on a hot plate at 140° C. for 60 seconds. Then, the photoresist film is developed by an immersion method for 60 seconds using 2.38% TMAH solution of the solution temperature of 23° C. Subsequently, a rinse process with pure water is performed for 60 seconds. As a result, only the non-exposed portion of the photoresist film is dissolved and removed into the a developer. A negative type pattern of 0.25 μmL/S was obtained with the exposure dose 65 mJ/cm².

(Embodiment 7)

Like the embodiment 2, the photoresist material is produced using methylated dimethylolguanamine instead of MW30 and succinimide toluensulfonate ester shown the following chemical formula C2 instead of norbornyl(2-oxocyclohexyl)methylsulfonium trifluolomethanesulfonate and a film is produced from the photoresist material. Then, the exposing experiment was performed in the same manner as in the embodiment 6. As a result, a negative type pattern of 0.35 μmL/S was obtained. with the exposure dose of 97 mJ/cm².

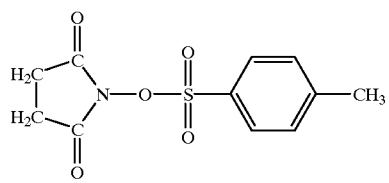

(C2)

(Embodiment 8)

Like the embodiment 3, the photoresist material is produced using a compound having the structure shown by the following chemical formula (C3) instead of norbornyl(2-oxocyclohexyl)methylsulfonium trifluolomethanesulfonate and polymer A2 instead of A1 and a thin film is produced from the photoresist material. Then, the lithographic experiment was performed. As a result, a negative type pattern of 0.325 μmL/S was obtained with the exposure dose of 72 mJ/cm².

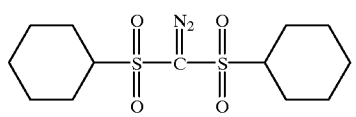

(C3)

As seen from the above description, the negative type photoresist material of the present invention is superior in the transparency so that it can be used for lithography which uses the short wavelength light such as the ArF excimer laser. Also, the negative type photoresist material of the present invention has the dry etching durability and high resolution, it is possible to use the negative type photoresist material for the fine pattern formation which is necessary to manufacture a semiconductor device.

What is claimed is:

1. A negative photoresist composition comprising:
   a polymer which contains a repetition unit which is expressed by a general chemical formula (1) and has a weight average molecule weight in a range of 1000 to 500000;
   a crosslinker composed of a compound which contains a functional group which is expressed by a general chemical formula (2); and
   a photo-acid generator which generates acid in response to a light

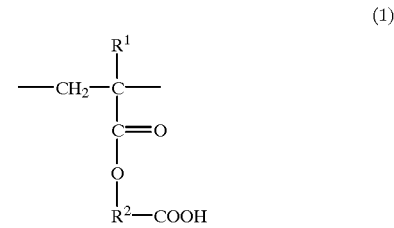

(1)

where in the general chemical formula (1), $R^1$ is a hydrogen atom or a methyl group, $R^2$ is an alkylene group containing carbon atoms in a range of 7 to 18 and having a bridged cyclic hydrocarbon group, and

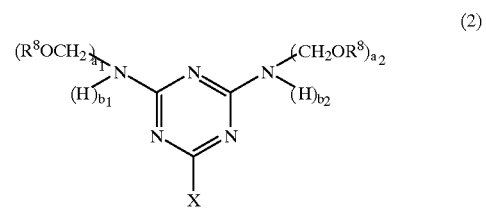

(2)

where in the general chemical formula (2), X is a group expressed by a general chemical formula (3), a hydrogen atom, a hydrocarbon group containing carbon atoms in a range of 1 to 6, an alkoxy group containing carbon atoms in a range of 1 to 3, or a hydroxyl group, a1, a2 and a3 are 1 or 2, respectively, b1, b2 and b3 are 0 or 1, respectively, and a1+b1=2, a2+b2=2, and a3+b3=2, and $R^8$ is a hydrogen atom, or an alkyl group containing carbon atoms in a range of 1 to 6,

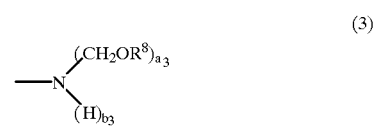

(3)

2. A negative photoresist composition according to claim 1, wherein said polymer is a polymer which is expressed by a general chemical formula (4),

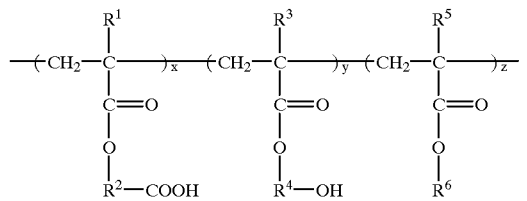

(4)

where in the general chemical formula (4), each of $R^1$, $R^3$ and $R^5$ is a hydrogen atom or a methyl group, $R^2$ and $R^4$ are an alkylene group containing carbon atoms in a range of 7 to 18 and having a bridged cyclic hydrocarbon group, $R^6$ is a hydrogen atom or an alkyl group containing carbon atoms in a range of 1 to 12, x, y and z satisfies x+y+z=1, 0<x<1, 0<y<1, and 0≦z<1, and a weight average molecule weight of the polymer is in a range of 1000 to 500000.

3. A negative photoresist composition according to claim 2, wherein said negative type photoresist composition contains said polymer expressed by the general chemical formula (4) in an amount of 50–98 weight percent, said crosslinker in an amount of 1–50 weight percent, and said photo-acid generator in an amount of 0.2–15 weight percent.

4. A negative photoresist composition according to claim 1, wherein said crosslinker is melamine derivative expressed by a general chemical formula (5),

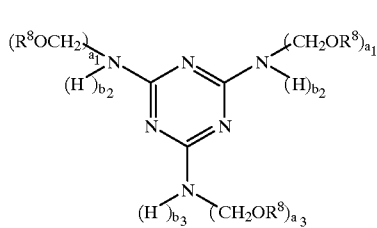
(5)

where in the general chemical formula (5), $R^8$ is a hydrogen atom or an alkyl group containing carbon atoms in a range of 1 to 6, and a1, a2 and a3=1 or 2, b1, b2 and b3=0 or 1, a1+b1=2, a2+b2=2, and a3+b3=2.

5. A negative photoresist composition according to claim 1, wherein said crosslinker is guanamine derivative which is expressed by a general chemical formula (6),

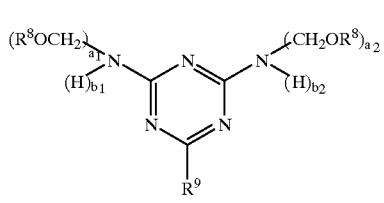
(6)

where in the general chemical formula (6), $R^8$ is a hydrogen atom or an alkyl group containing carbon atoms in a range of 1 to 6, $R^9$ is a hydrogen atom, an alkoxy group containing carbon atoms in a range of 1 to 4, or an alkyoxy group containing carbon atoms in a range of 1 to 4, or a hydroxyl group, and a1 and a,2=1 or 2, b1 and b2=0 or 1, a1+b1=2, and a2+b2=2.

6. A negative photoresist composition according to claim 1, wherein said photo-acid generator is a sulfonium salt compound which is expressed by a general chemical formula (7),

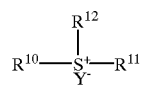
(7)

where in the general chemical formula (7), $R^{10}$, $R^{11}$ and $R^{12}$ are respectively independently alkyl substituted, halogen substituted or an aromatic group of non-substitution, an alicyclic group, a bridged cyclic hydrocarbon group, 2-oxoalicyclic group, or an alkyl group, and $Y^-$ is a counter anion expressed by $BF_4^-$, $AsF_6^-$, $SbF_6^-$ or a general chemical formula (8),

(8)
$$Z\text{—}SO_3^-$$

where in the general chemical formula (8), Z is $C_nF_{2n+1}$ (n is an integer in a range from 1 to 6), or an alkyl group, alkyl substituted, halogen substituted, or an aromatic group of non-substitution.

7. A negative photoresist composition according to claim 1, wherein said photo-acid generator is an iodonium salt compound which is expressed by a general chemical formula (9),

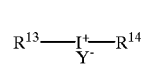
(9)

where in the general chemical formula (9), $R^{13}$ and $R^{14}$ are respectively independently alkyl substituted, halogen substituted, an aromatic group of non-substitution, an alicyclic group, a bridged cyclic hydrocarbon group, 2-oxoalicyclic group, or an alkyl group, and $Y^-$ is a counter anion expressed by $BF_4^-$, $AsF_6^-$, $SbF_6^-$, or a general chemical formula (8),

(8)
$$Z\text{—}SO_3^-$$

where in the general chemical formula (8), Z is $C_nF_{2n+1}$ (n is an integer in a range from 1 to 6), an alkyl group, alkyl substituted, halogen substituted or an aromatic group of non-substitution.

8. A negative photoresist composition according to claim 1, wherein said photo-acid generator is a succinimide derivative which is expressed by a general chemical formula (10),

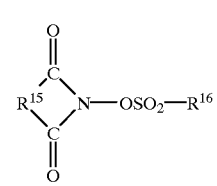
(10)

wherein in the general chemical formula (10), $R^{15}$ is halogen substituted, or an alkylene group of non-substitution, alkyl substituted, halogen substituted, or an aromatic group of non-substitution, $R^{16}$ halogen substituted, an alkyl group of non-substitution, an alkyl group, halogen substituted or an aromatic group of non-substitution.

9. A negative photoresist composition according to claim 1, wherein said photo-acid generator is a diazomethane derivative which is expressed by a general chemical formula (11),

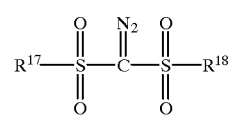
(11)

where in the general chemical formula (11), $R^{17}$ and $R^{18}$ are respectively independently an alkyl group, alkyl substituted, halogen substituted or an aromatic group of non-substitution, an alicyclic hydrocarbon group, or a bridged cyclic hydrocarbon group.

10. A negative photoresist composition according to claim 1, wherein said negative type photoresist composition contains said polymer expressed by the general chemical formula (1) in an amount of 50–98 weight percent, said crosslinker in an amount of 1–50 weight percent, and said photo-acid generator in an amount of 0.2–15 weight percent.

11. A method of forming a photoresist pattern, comprising the steps of:

applying a negative photoresist composition on a substrate;

exposing said negative photoresist composition to a light having a wavelength of 180 to 220 nm;

baking said substrate on which said negative type photoresist composition is applied; and developing said baked substrate, and wherein said negative photoresist composition comprises:
a polymer which contains a repetition unit which is expressed by a general chemical formula (12);
a crosslinker composed of a compound which contains a functional group which is expressed by a general chemical formula (13); and
a photo-acid generator which generates acid in response to a light

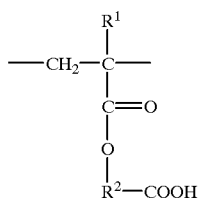

(12)

where in the general chemical formula (12), $R^1$ is a hydrogen atom or a methyl group, $R^2$ is an alkylene group containing carbon atoms in a range of 7 to 18 and having a bridged cyclic hydrocarbon group, and a weight average molecule weight of the polymer is in a range of 1000 to 500000, and

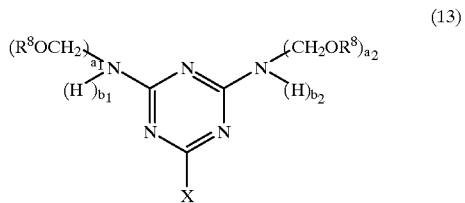

(13)

where in the general chemical formula (13), X is a group expressed by a general chemical formula (14),

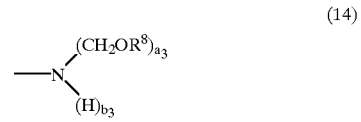

(14)

a hydrogen atom, a hydrocarbon group containing carbon atoms in a range of 1 to 6, an alkoxy group containing carbon atoms in a range of 1 to 3, or a hydroxyl group, a1, a2 and a3 are 1 or 2, respectively, b1, b2 and b3 are 0 or 1, respectively, and a1+b1=2, a2+b2=2, and a3+b3=2, and $R^8$ is a hydrogen atom, or an alkyl group containing carbon atoms in a range of 1 to 6.

12. A method according to claim 11, wherein said light with the wavelength of 180 nm to 220 nm is an ArF excimer laser light.

* * * * *

UNITED STATES PATENT AND TRADEMARK OFFICE
CERTIFICATE OF CORRECTION

PATENT NO. : 6,140,010
DATED : October 31, 2000
INVENTOR(S) : Shigeyuki Iwasa, Katsumi Maeda, Kaichiro Nakano, Etsuo Hasegawa It is certified that error appears in the above-identified patent and that said Letters Patent is hereby corrected as shown below:

Column 1,
Line 67, delete "15"

Column 10,
Lines 25-26, delete ".$0^2{}_7$." insert -- .$0^{2,7}$ --;
Lines 26-27, delete ".$1^3{}_6$. Insert -- .$1^{3,6}$ --.

Column 23,
Line 6, delete " [structure] " insert -- [structure] --.

Signed and Sealed this

Eleventh Day of December, 2001

Attest:

NICHOLAS P. GODICI
Attesting Officer   Acting Director of the United States Patent and Trademark Office